United States Patent
Rameau et al.

(10) Patent No.: US 7,495,662 B2
(45) Date of Patent: Feb. 24, 2009

(54) PART DESIGN SYSTEM USING A CONTEXT-FREE GRAMMAR

(75) Inventors: Jean-Francois Rameau, Lisses (FR); Florence Hu-Aubigny, La Garenne Colombes (FR)

(73) Assignee: Dassault Systemes (FR)

( * ) Notice: Subject to any disclaimer, the term of this patent is extended or adjusted under 35 U.S.C. 154(b) by 0 days.

(21) Appl. No.: 10/898,068

(22) Filed: Jul. 23, 2004

(65) Prior Publication Data

US 2005/0038642 A1 Feb. 17, 2005

(30) Foreign Application Priority Data

Jul. 25, 2003 (EP) .................. 03291846

(51) Int. Cl.
*G06T 17/00* (2006.01)

(52) U.S. Cl. ...................... 345/420; 345/419

(58) Field of Classification Search ............... None
See application file for complete search history.

(56) References Cited

U.S. PATENT DOCUMENTS

| | | | | |
|---|---|---|---|---|
| 5,859,786 A | | 1/1999 | Klein | 364/578 |
| 6,629,065 B1 * | | 9/2003 | Gadh et al. | 703/1 |
| 2003/0085889 A1 * | | 5/2003 | Chin et al. | 345/419 |

FOREIGN PATENT DOCUMENTS

EP 1 302 904 4/2003

OTHER PUBLICATIONS

European Search Report for EP 03291846 dated Feb. 2, 2004.
A.H.M. ter Hofstede et al., "Data Modelling in Complex Application Domains," Proceedings of the Fourth International Conference Caise '92 on Advanced Information Systems Engineering, May 1992, vol. 593, pp. 364-377.
J. Kripac, "A Mechanism for Persistently Naming Topological Entities in History-Based Parametric Solid Models," Computer Aided Design, Feb. 1, 1997, vol. 29, No. 2, pp. 113-122.
Lin Feng et al, "Structure Modeling and Context-Free Grammar: Exploring a New Approach for Surface Boundary Construction," Computer & Graphics, vol. 21, No. 6, 1997, pp. 777-785.

* cited by examiner

*Primary Examiner*—Ulka Chauhan
*Assistant Examiner*—Daniel F Hajnik
(74) *Attorney, Agent, or Firm*—Isabel Cantallops; Clifford Chance US LLP

(57) ABSTRACT

A declarative system for designing parts or assemblies of parts is based on a history-based design system (40), which has a storage format with primitives and operations; a modeled object is defined in the history based design system by an ordered sequence of operations and primitives. The declarative system has several functional features, which may be selected (48) and instantiated by a end user by providing a set of specifications (46) to a end-user interface (44). An instantiated functional feature provides contributions (50), each contribution being an ordered sequence of operations and primitives of the history-based design system. Contributions (50) are received by a seed structure (52). The seed structure is defined in a context-free grammar. The seed structure orders operations and primitives of received contributions provides an ordered sequence (54) of operations and primitives to the history based system. An editor (56) makes it possible to edit the seed structure in the grammar.

19 Claims, 13 Drawing Sheets

PART DESIGN SYSTEM USING A CONTEXT-FREE GRAMMAR

RELATED APPLICATIONS

This application claims priority to European patent application no. 03291846.8 filed Jul. 25, 2003.

FIELD

The invention relates to the field of computers programs and system, and more specifically to part design programs and systems.

A number of systems and programs are offered on the market for the design of parts or assemblies of parts, such as the one provided by the applicant under the trademark CATIA. These so-called computer-aided design (CAD) systems allow a user to construct and manipulate complex three-dimensional (3D) models of parts or assembly of parts.

A number of different modeling techniques can be used to create a model of an assembly. These techniques include solid modeling, wire-frame modeling, and surface modeling. Solid modelling techniques provide for topological 3D models, where the 3D model is a collection of interconnected edges and faces, for example. Geometrically, a 3D solid model is a collection of trimmed surfaces that defines a closed skin. The trimmed surfaces correspond to the topological faces bounded by the edges. The closed skin defines a bounded region of 3D space filled with the part's material. Wire-frame modeling techniques, on the other band, can be used to represent a model as a collection of simple 3D lines, whereas surface modeling can be used to represent a model as a collection of exterior surfaces. CAD systems may combine these, and other, modeling techniques, such as parametric modeling techniques.

Parametric modeling techniques can be used to define various parameters for different features and components of a model, and to define relationships between those features and components based on relationships between the various parameters. Solid modeling and parametric modeling can be combined in CAD systems supporting parametric solid modeling.

A design engineer is a typical user of a 3D CAD system. The design engineer designs functional, physical and aesthetic aspects of 3D models, and is skilled in 3D modeling techniques. The design engineer creates parts and may assemble the parts into one or more subassemblies. In addition to parts, a subassembly may also consist of other subassemblies. Using parts and subassemblies, the design engineer designs an assembly. Hereinafter, parts and subassemblies are collectively referred to as "components".

A part or component is constructed using various geometric building blocks, using tools generally provided in CAD systems. The order in which a design engineer creates features while constructing a part affects the physical structure of that part in a feature-based CAD. These systems are therefore history-based. For example, a part constructed first by cutting a block with a cylinder and then adding a boss that extends inside the void left by the cut cylinder will result in a hole with material from the boss inside the hole. If the order of the operations were reversed such that the boss was added before the cylindrical cut, then the cut would not only cut the material of the original block, but also that of the subsequent boss, resulting in a hole with no material inside of it. This is exemplified in FIGS. 1 to 3, which show a window displayed on the screen of a prior art CAD system. FIG. 1 shows a window 2 that contains three views of a part under construction. The top view 4, front view 6, and rotated view 8 reveal that the part is partially defined by two block features (i.e., upper block 12 and lower block 14). Additionally, the top view 4 and the front view 6 plainly show an extruded profile 10 of a circle. The purpose of the extruded profile 10 is to create a cylindrical cut feature in the part. FIG. 2 shows the window 2 after the extruded profile 10 was used to construct a cut feature. The cut 16 was created by subtracting material that was located within the extruded profile 10 from the upper block 12 and the lower block 14. The cut 16 would appear as illustrated in FIG. 2 in a history-based CAD system if the upper block 12 and the lower block 14 were included in the part definition (i.e., existed) prior to the inclusion of cut feature 16. FIG. 3 shows the window 2 containing a part in which a cut feature 18 did not subtract material from the upper block 12. The cut 18 may appear as illustrated in FIG. 3 in a history-based CAD system if the lower block 4 was included in the part definition first, the cut feature 18 was included in the part definition second, and the upper block was included in the part definition third. The example of FIG. 1-3 shows that the order in which features are entered for defining a component influences the output shape of the component. This discussion in reference to mechanical parts applies to other types of parts or components in a design system, e. g. moulded parts, electrical features in a circuit, or more generally any type of features the assembly of which forms parts or components.

EP-A-1 302 904 offers a solution to the problem of features order in such history-based CAD systems. It is based on the principle of separating feature creation order and feature regeneration order. Feature creation refers to the order in which a user adds features to a component; feature regeneration order refers to the order in which the geometric feature operations are applied to the underlying geometric model. This is achieved by associating to a given feature a feature scope, representative of the other features on which the given feature will have effects. The feature scope may be explicit—in which case the CAD system user would explicitly build a list of the other features on which a given feature will act. The feature scope may be implicit; it is then automatically defined by the system, based on a system of rules, e.g. relying on the order in which the features are introduced, on a proximity calculation or on attributes of the features. Explicit definition of feature scope creates an additional burden on the user. Implicit definition of feature scope is limited to a given number of pre-programmed rules. This document further discusses dynamically grouping and ordering features, according to the feature scopes, to build feature chains. A feature chain maintains three volumes; the first volume is a positive volume that combines all features that add material; the second volume is a negative volume that combines all features that remove material. The third volume combines the positive and negative volume. Features chains are created and represented by features trees; these trees are created taking into account the feature scopes. The system is thus dependent on feature scopes for building feature trees. More generally, the solution proposed in this patent to tantamount to changing a temporal complexity—the order in which features are defined—into scopes. However, defining scopes may be as complicated as defining a proper order for features.

US-A-2002/0133803 discusses a horizontally-structured CAD-CAM modelling system. This document suggests defining datum plane and linking new features to the datum planes. Thus, features are supposed to be amendable independently of each other. This solution makes it necessary for the user to define datum planes and to decide, for each new feature, to which datum plane the feature should be attached. This solution makes it possible to amend some features independently of other features. However, it does not address the problem of temporal order of features, as discussed above. Referring again to the example of FIGS. 1-3, the fact that the upper block, the lower block and the extruded profile are "attached" to the same datum plane does not change the fact that the order in which these features are defined may change the resulting part or component.

Other systems are proposed, which are not history dependent. These include systems relying on boundary representation modelling. The system only stores the boundary representation and not the sequence of actions of the user for defining the representation. A problem with these systems is that they hardly allow the user to modify or amend already designed structures. More specifically, these systems may provide tools for helping the user in generating new structures; these tools extrapolate the existing boundaries and only operate for limited changes to the boundaries. They also rely on a limited series of pre-programmed changes. FIG. 4 is an example of a cross-section of a part in a boundary representation modelling. The part is a volume 20 in which a hole 22 is drilled; the hole has a shape defined by the revolution of a curve 24 around an axis 26 and by a bottom 28. A displacement of the bottom 28 of the hole toward the position 30 represented in dotted lines may be allowed by the system—if the bottom is identified as a line by the system. If this is not the case, moving the bottom may involve fully re-designing the bottom. In addition, if the bottom is moved, the lower part of wall 24 needs to be extended. This may involve re-designing the lower part of the wall. On the contrary, in a history-based system, the lower part of wall 24 could be defined as a relimitation of a conical surface and would be easily extended, simply by "replaying" the design scenario—"replaying" the relimitation step. This example demonstrates some of the advantages of history-based systems: they capture the design intention of the end-user; in other words, they reflect successive design steps. History based systems also allow easy a posteriori changes.

Thus, there exists a need for a CAD system, which would be simpler to use and still provide the advantages of history-dependent systems. The system should preferably be easy to adapt to the needs of the user and to the field of the art where it is used.

According to the invention, there is provided a system for designing parts or assemblies of parts, with (a) a history-based design system having a storage format with primitives and operations, a part or assembly of parts being defined in the history based design system by an ordered sequence of operations and primitives;

(b) at least two functional features, each of which is adapted to be instantiated by a end user by providing a set of specifications, an instantiated functional feature providing at least a contribution, a contribution being an ordered sequence of operations and primitives of the history-based design system;

(c) a seed structure defined using a context-free grammar, the seed structure being adapted to receive contributions from instantiated functional features, to order operations and primitives of received contributions and to provide an ordered sequence of operations and primitives to the history based system;

(d) an editor for editing the seed structure in said grammar.

The operations may comprise commutative operations and non-commutative operations; the seed structure would then have inputs adapted to receive contributions. The seed structure would be adapted to apply commutative operations to the contributions received on each input and to apply commutative or non-commutative operations to the results of the commutative operations applied to said contributions.

The seed structure is preferably represented in the context-free grammar as an acyclic oriented graph. It may be a binary tree, or a non-binary tree.

A terminal alphabet of the context free grammar preferably comprises at least a solid, union, intersection and subtraction. One may add juxtaposition to the terminal alphabet.

In one embodiment, the terminal alphabet of the context free grammar comprises curves, surfaces and relimitation.

The invention also provides a process for providing a history-free system for the design of parts or assemblies of parts, the process comprising the steps of (a) providing a history-based design system having a storage format with primitives and operations, a part or assembly of parts being defined in the history based design system by an ordered sequence of operations and primitives;

(b) providing at least two functional features, each of which is adapted to be instantiated by a end user by providing a set of specifications, an instantiated functional feature providing at least a contribution, a contribution being an ordered sequence of operations and primitives of the history-based design system;

(c) using a context-free grammar to define a seed structure, the seed structure being adapted to receive contributions from instantiated functional features, to order operations and primitives of received contributions and to provide an ordered sequence of operations and primitives to the history based system.

In one embodiment, the operations comprise commutative operations and non-commutative operations; the step of using comprises providing a seed structure having inputs adapted to receive contributions and the seed structure adapted to apply commutative operations to the contributions received on each input and to apply commutative or non-commutative operations to the results of the commutative operations applied to said contributions.

The step of using preferably comprises defining the seed structure as an acyclic oriented graph; the seed structure may then be defined as a binary or non-binary tree.

A computer-aided design system embodying the invention will now be described, by way of non-limiting example, and in reference to the accompanying drawings, where:

Figure 8:
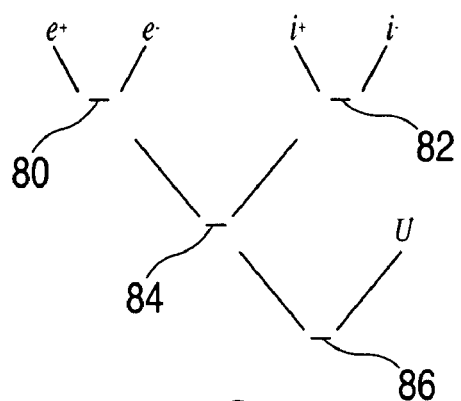
FIG. 8 shows a seed structure in the first embodiment.
Figure 13:
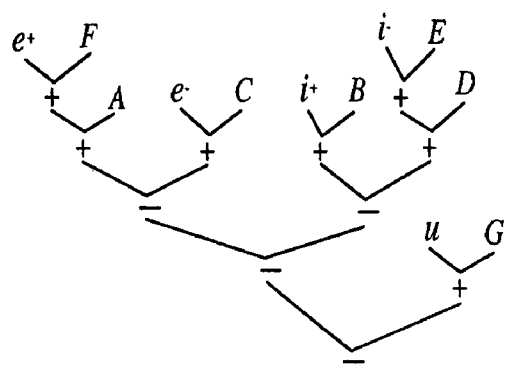
FIG. 13 shows the seed structure with the contributions of this second functional feature.
Figure 21:
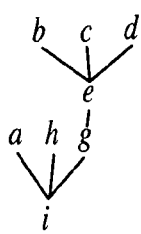
Figure 22:
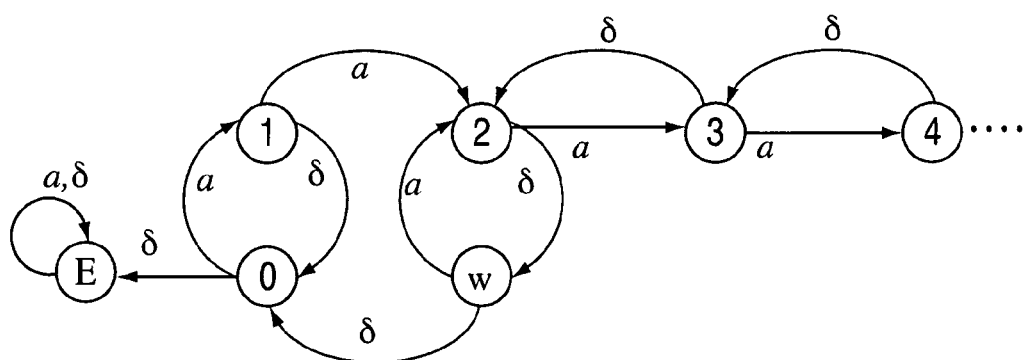
Figure 23:
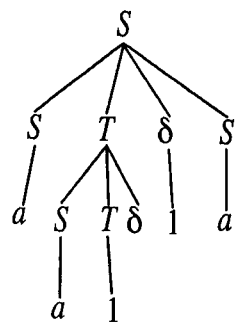
Figure 24:
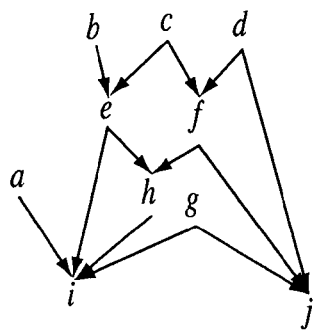
Figure 25:
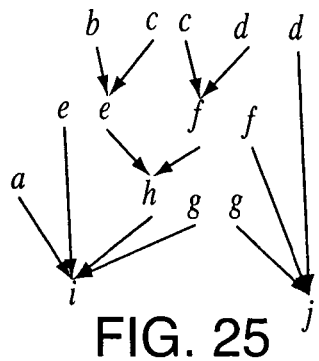
Figure 26:
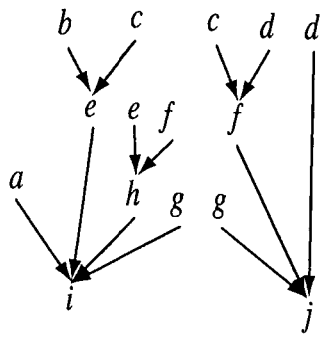
Figure 27:
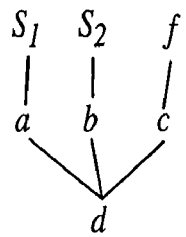
Figure 28:
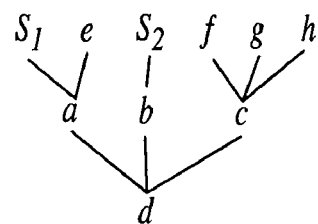
Figure 29:
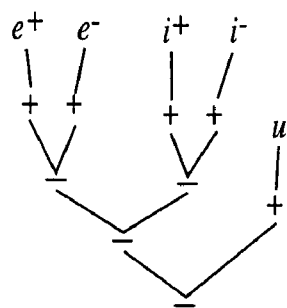
Figure 30:
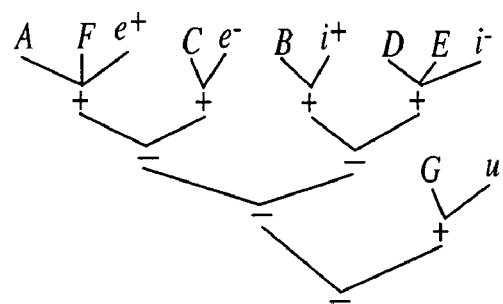
Figure 31:
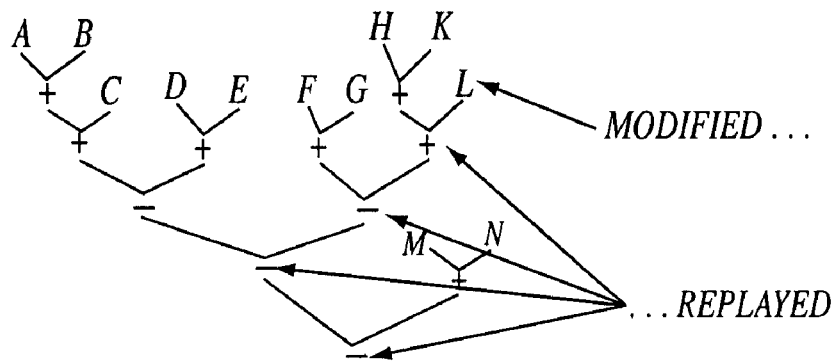
Figure 32:
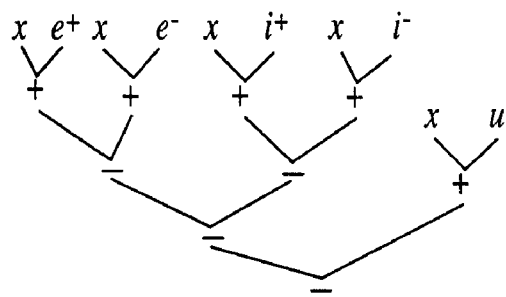
Figure 33:
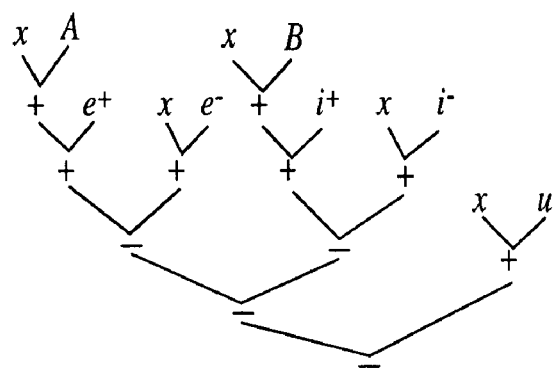
Figure 34:
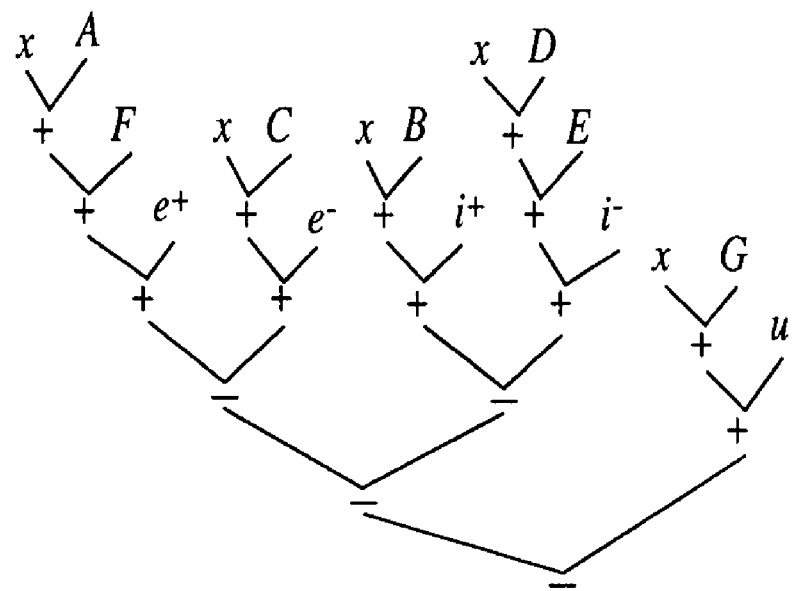
Figure 35:
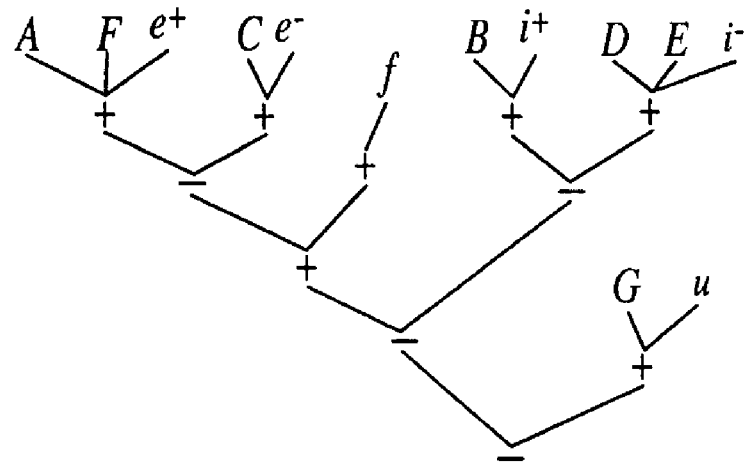

FIG. 21 examplifies a tree coded in a generic context-free grammar;

FIG. 22 is a schematic view of an automaton for checking the syntax of this grammar;

FIG. 23 is a graph of this grammar;

FIG. 24 is a directed acyclic graph;

FIG. 25 is a tree corresponding to the graph of FIG. 24;

FIG. 26 is another tree corresponding to the graph of FIG. 24;

FIG. 27 exemplifies another tree structure in a context-free grammar;

FIG. 28 shows the tree of FIG. 27, completed with various additional components;

FIG. 29 is a non-binary tree corresponding to the tree of FIG. 8;

FIG. 30 is a non-binary tree corresponding to the tree of FIG. 13;

FIG. 31 shows the impact of a change to a leaf of the tree;

FIG. 32 is another seed structure;

FIG. 33 shows the seed structure of FIG. 32 with the contributions of a first functional feature;

FIG. 34 shows the seed structure of FIG. 32 with the contributions of a second functional feature;

FIG. 35 is another example of a tree similar to the one of FIG. 30.

In the rest of this specification, the words "part" or "assembly of parts" is used to designate an object modeled or designed in a computer-aided design system.

Figure 5:
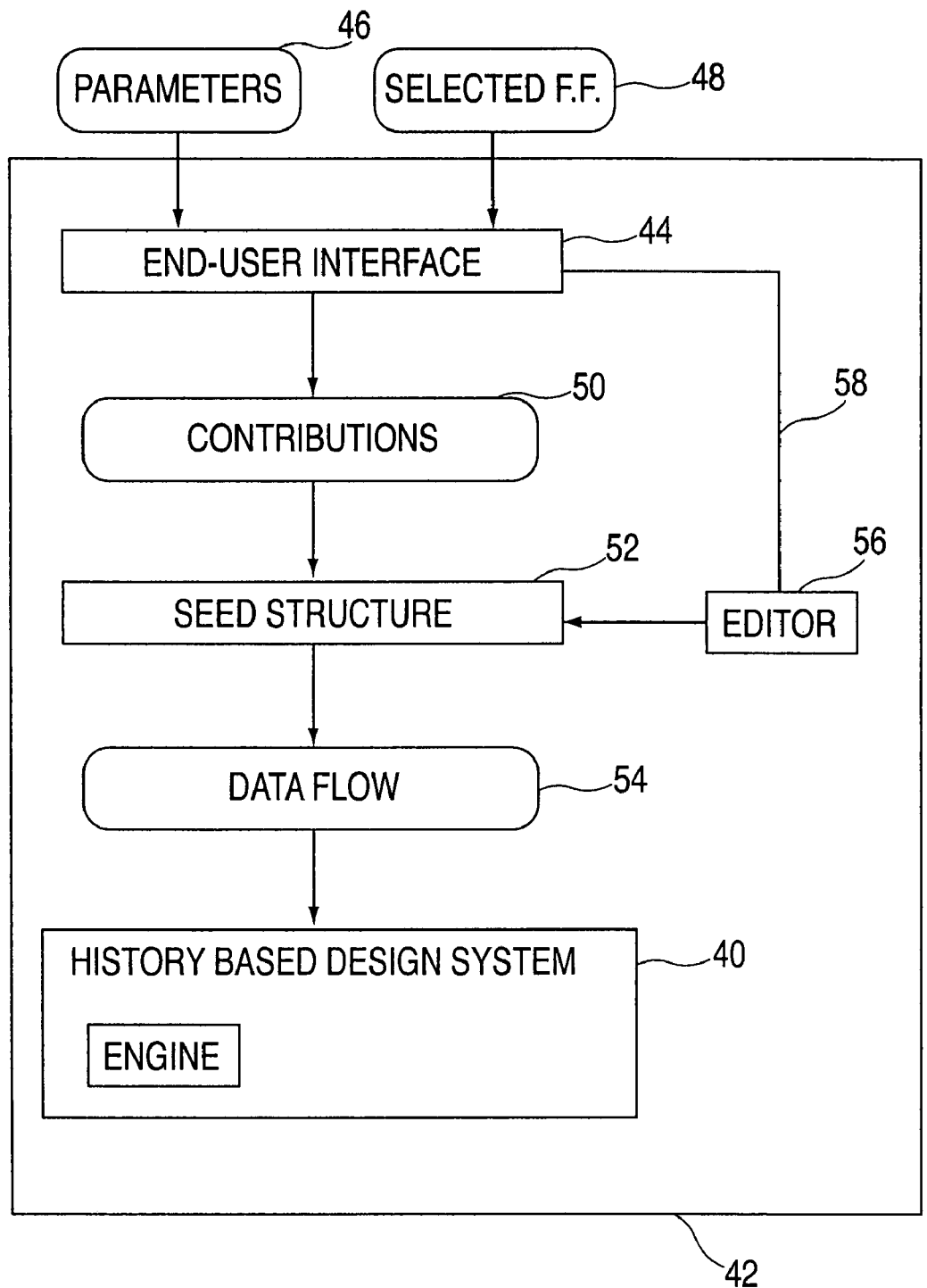
FIG. 5 is a schematic view of the structure of a design system embodying the invention.

In reference to FIG. 5, the general structure of a system according to the invention is discussed.

Figure 7:
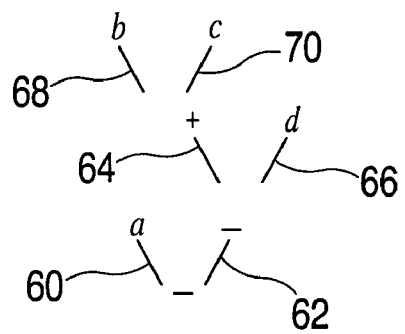
FIG. 7 is an example of a binary tree coded in this context-free grammar.
Figure 6:
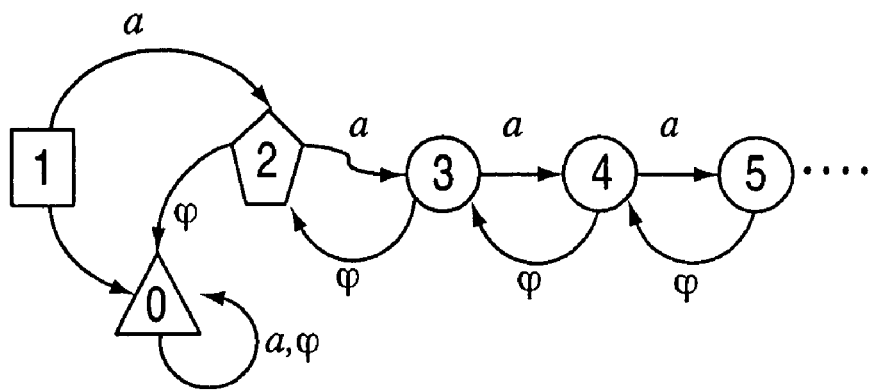
FIG. 6 shows a pushdown automaton for checking the syntax in a context-free grammar.

Explanations are provided in reference to FIGS. 6 and 7, as regards context free grammars.

A first embodiment of the invention is discussed in reference to FIGS. 8-18; the invention is applied to the modeling of thin solids.

Figure 19:
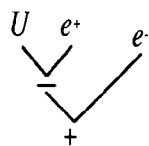
FIG. 19 is a partial view of a seed structure in the second embodiment of the invention.
Figure 20:
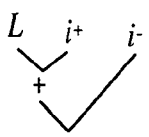
FIG. 20 is another partial view of the seed structure for the second embodiment.

A second embodiment of the invention is discussed in reference to FIGS. 19-20. The invention is applied to the concurrent modeling of thin solids with the corresponding moulds.

A third embodiment of the invention is discussed in reference to FIG. 21-30 and 35. A generic context-free grammar is disclosed, which makes it possible to represent seed structures in non-binary trees.

Last, a fourth embodiment of the invention is discussed in reference to FIGS. 31-34. This embodiment allows a fast evaluation of the modeled object in a B-rep evaluator.

The invention makes it possible for the user of the CAD system to design parts or assemblies of parts without worrying about feature order. In essence, the system provided by the invention is a history-free design system. However, it includes a history based design system and therefore provides the advantages of such systems, as discussed above. It thus captures the design-intention of the user and permits a posteriori changes.

This is achieved by providing in the system
 a history-based or history dependent computer-aided design system;
 a set of functional features, that are accessed and instantiated by the end-user and
 a seed structure.

Figure 1:
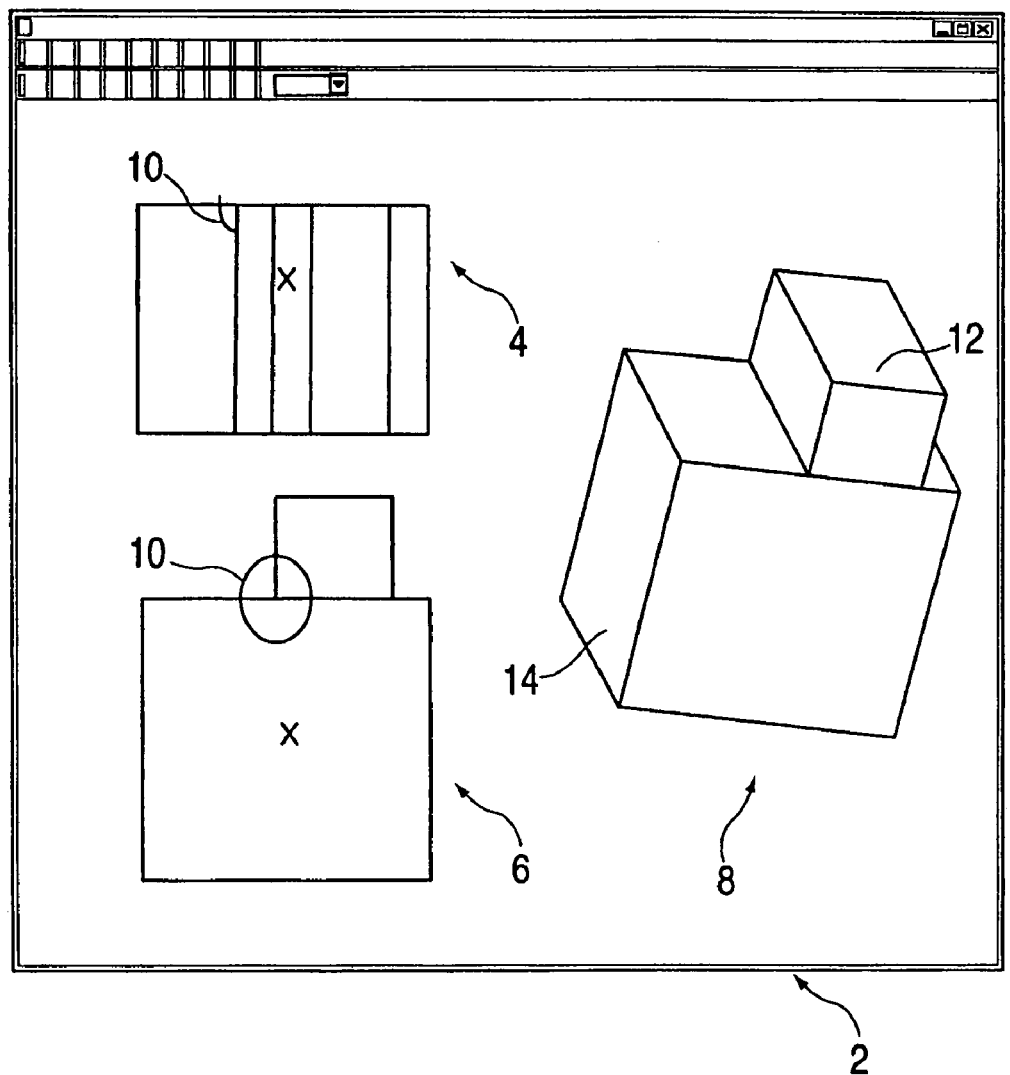
FIGS. 1-3 are view of components in a prior art history-based system.
Figure 2:
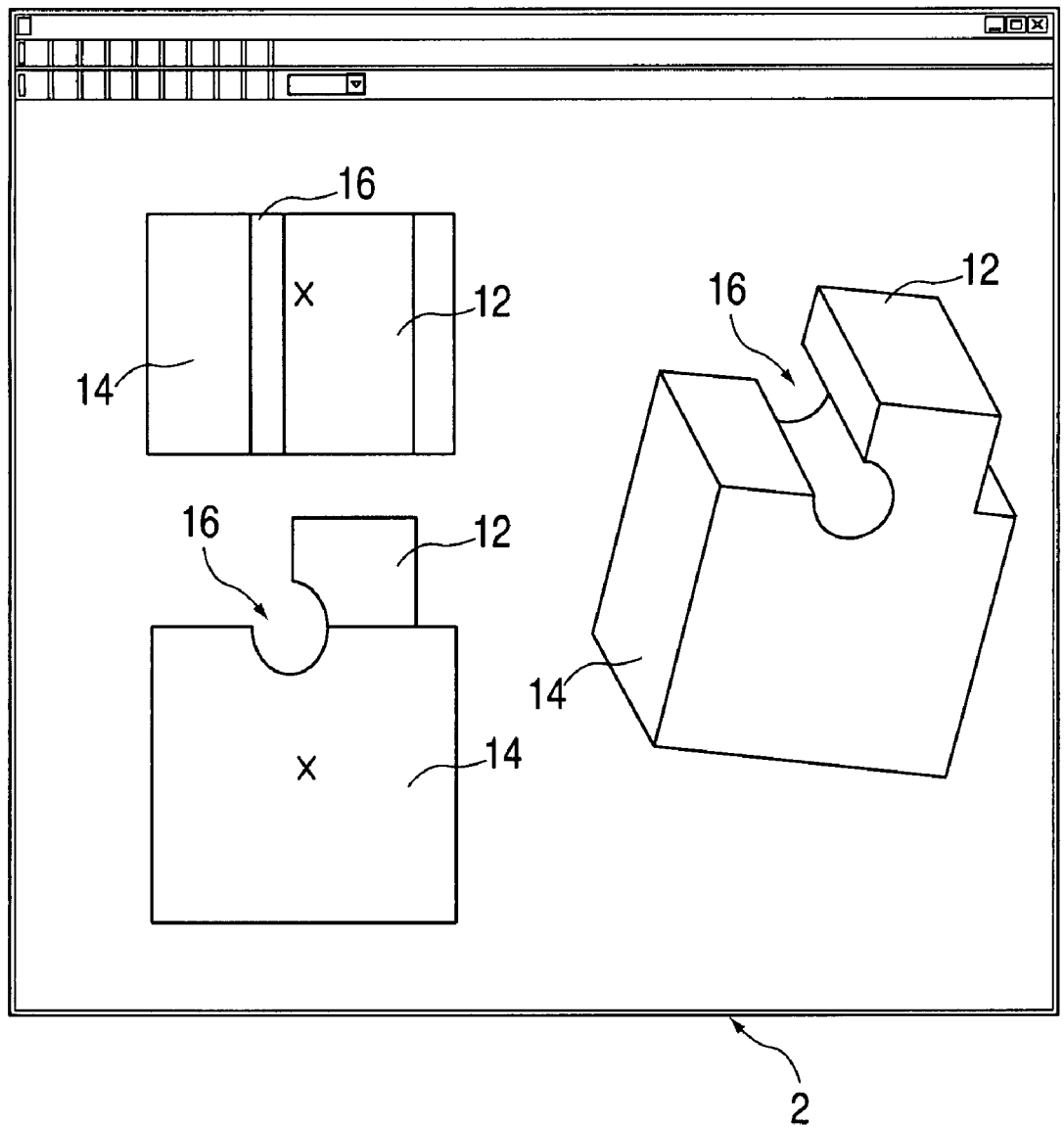
Figure 3:
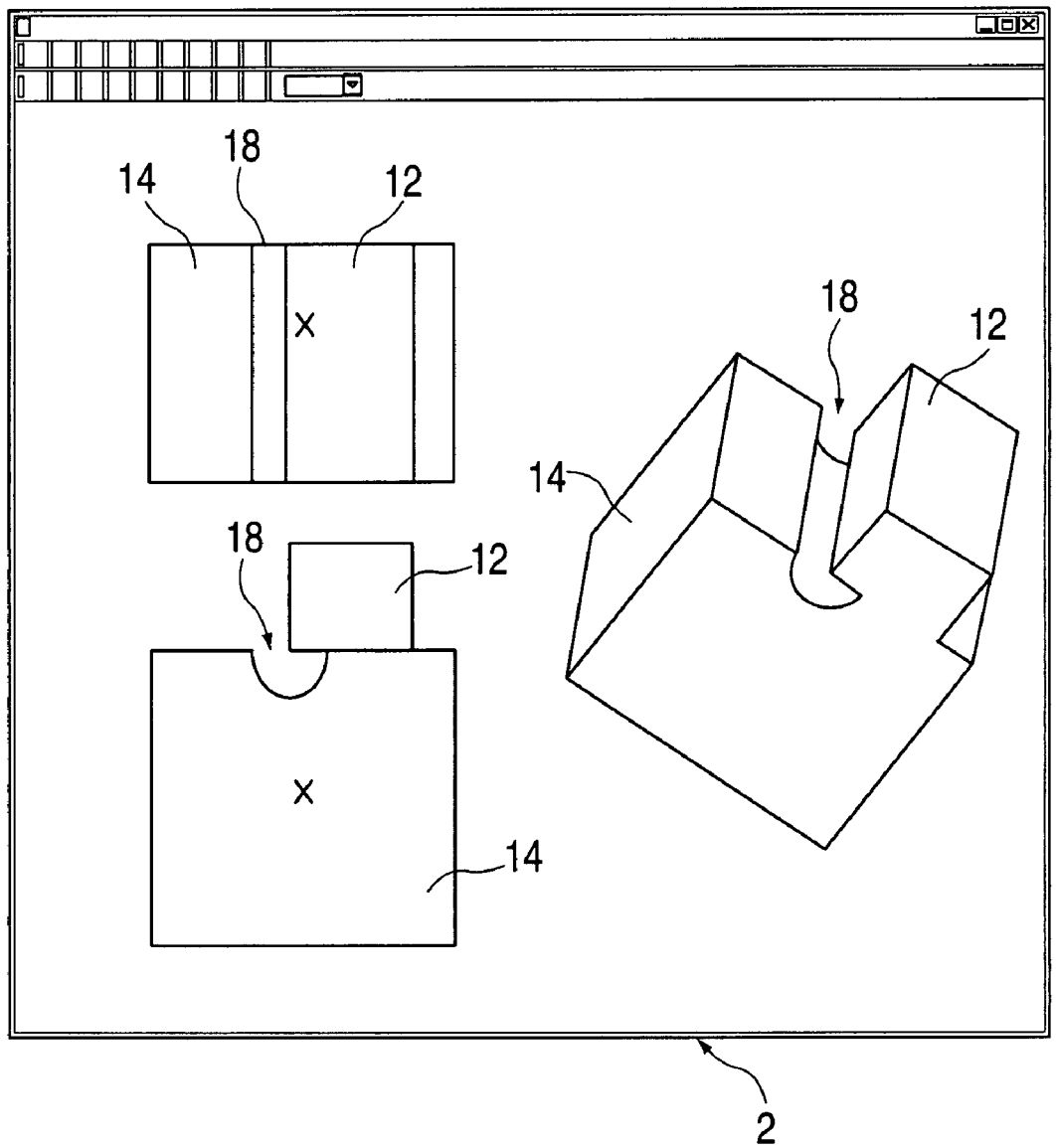
Figure 4:
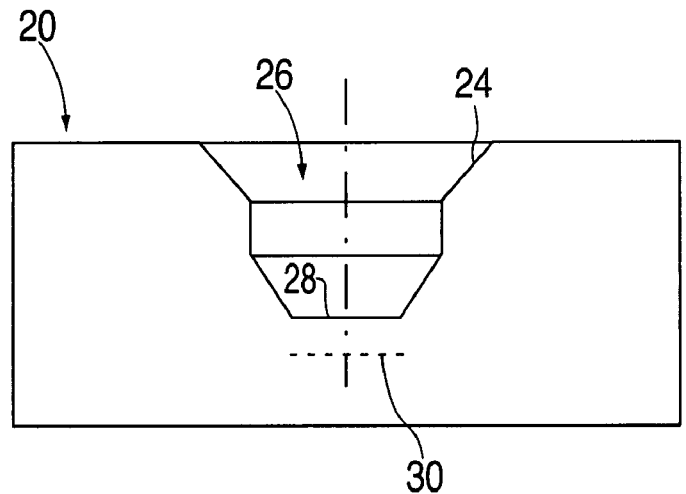
FIG. 4 is a cross-section view of a component in a boundary-modelling system.

In the history-based design system, modeled objects are defined by an ordered sequence of operations and primitives. The system is adapted to receive data in the form of such ordered sequences. Examples of primitives—blocks—are given in reference to FIG. 1-3 in a design system adapted for the modeling of solid objects. Examples of operations include assembling, e.g. as applied to the two blocks of FIG. 1, or cutting, e.g. as applied in FIGS. 2 and 3 at various stages. The importance of the order in the sequence is exemplified in reference to FIGS. 1-3. Such history-based design systems are well known to the person skilled in the art and include the CATIA system referred to above. Primitives and operations available in such systems are also known to the person skilled in the art.

The history based system is represented at 40 in FIG. 5 and is not further detailed. It is sufficient to say that this system 40, also referred to as the "core system" in the rest of the specification is adapted to receive an ordered sequence of primitives and operations. It may then evaluate the received sequence to compute a modeled object, display the modeled object to the user, store the sequence or provide any additional handling of the received ordered sequence. One may use in this system a B-rep type evaluator. A B-rep type evaluator is a geometrical and topological algorithm that computes the boundary description of the resulting solid from the boundary descriptions of the input solids.

The system of the invention 42 is history-free and declarative. It comprises a end-user interface 44; this interface provides the end-user with the ability of selecting functional features out of the set of functional features and instantiating the selected functional feature with parameters. This is schematically represented in FIG. 5 by parameters 46 and selected functional features 48, which are input to end-user interface 42. Functional features represent design functions that are relevant for the field of the art at stake. For instance, if the design system is applied to the design of solids, functional features could comprise housings, through holes, blind holes. Other examples of functional features are discussed below. A given functional feature may be instantiated by providing parameters or values relevant for the selected functional feature. For instance, a housing could be instantiated by providing the following parameters: a profile, a height and a thickness. A through hole could be instantiated by providing a positioning point, an axis and a diameter. A blind hole could be instantiated by providing a positioning point, an axis, a diameter as well as a depth. A discussed below, the set of functional features may be adapted by an expert user.

User interface 44 outputs contributions 50, which are applied to the seed structure 52. Contributions are discussed in detail below. In essence, an instantiated functional feature input to the end-user interface 44 provides at least one contribution output by interface 44. A contribution is an ordered sequence of primitives and operations of the core system; a contribution is applied on a given input of the seed structure, as discussed below.

Contributions are applied to the seed structure 52. The seed structure receives contributions and based on the received contributions, provides to the core system 40 a data flow 54 which is an ordered sequence of primitives and operations, adapted to be handled by the core system. More specifically, the seed structure receives contributions and handles these contributions, by applying operations on the contributions or adding additional primitives. The seed structure does not separate or break a given contribution; in other words, a given contribution inputted to the seed structure is found in the resulting sequence provided by the seed structure.

The seed structure is built so that the order in which contributions are received does not change the result output by the seed structure, or more specifically, the evaluation of this result by the core system. This property of the seed structure is ensured since rules used for applying contributions to the seed structure are commutative;

each contribution is kept intact by the seed structure.

In essence, the end-user is provided with tools—the functional features—which appear to be commutative. The functional features may thus be instantiated by the end-user in any order. Non-commutative operations are either contained within contributions or are carried out by the seed structure. Since contributions are not split or broken in the seed structure, the order of primitives and operations in the contributions is not amended by the design system. Since the ordering in the seed structure is not user-dependent, non-commutative operations in the seed structure provide a result which is not user dependent.

In addition, the system is provided with an editor for editing the seed structure, which is represented schematically at 56 in FIG. 5. This editor makes it possible for an expert user to amend the seed structure and adapt it to the specific requirements of a given field of the art in which the design system is used. The seed structure is defined in a context-free grammar and may be edited in this grammar. Respecting syntactic rules in this grammar ensures that the seed structure will always keep the property of ordering the various contributions to provide the same evaluation of the output data flow in the core system 40, irrespective of the order in which the functional features are instantiated by the end-user.

In a preferred use of the invention, the expert user is a high skilled designer. He knows very well the technical field (sheet metal aerospace, machined parts for aerospace, automotive power train, ect.) as well as the CAD system behavior and limitations (manifold or non manifold solids, linear Constructive Solid Geometry structure, balanced Constructive Solid Geometry structures etc.). The end user is the mechanical designer and is provided with the various functional features. The way rights may be granted to users in a computer system is known to the person skilled in the art and is not detailed further.

As shown by arrow 58 in FIG. 5, the editor may also allow an expert user to change the set of functional features, e.g. for adding new functional features.

System 42, from the perspective of the end-user, has the advantages of allowing easy modeling of objects. First, there are provided functional features, adapted to the field of the art, which facilitate object modeling. Second, the order in which the functional features are instantiated is not relevant to the resulting modeled object.

Figure 15:
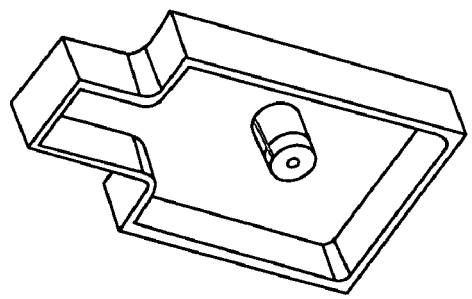
FIGS. 15-18 are views of other modelled object.
Figure 16:
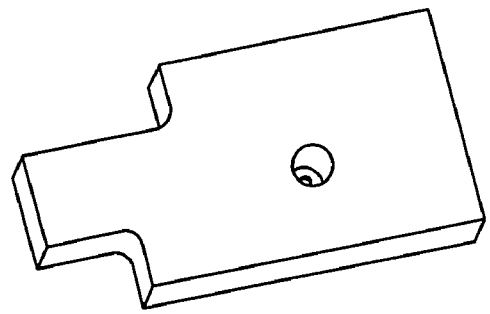
Figure 17:
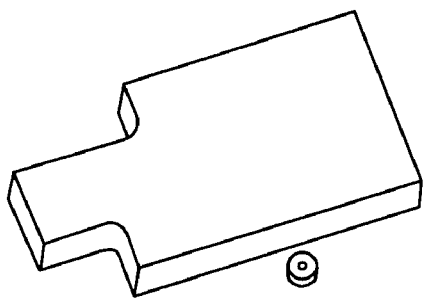
Figure 18:
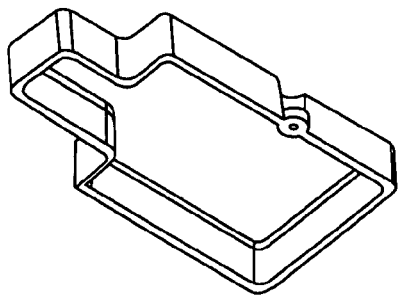

System 42 has the further advantage of being easily adapted to the field of the art, by editing the seed structure. This makes it possible to use the same design system for various fields of the art, while allowing an expert-user to customize the system. Several examples of seed structures are defined below. In the example of FIGS. 8-15, the seed structure is adapted to the design of thin plastic parts. In the example of FIGS. 16-17, the seed structure makes it possible to design at the same an upper and a lower mold. The description further gives the example in reference to FIGS. 27-30 of a seed structure adapted to optimize evaluation of modeled objects, in the case where interim results are stored. According to the capabilities of the core system, the seed structure may thus be adapted.

The editor makes it possible to adapt an existing seed structure to make it more efficient, according to the capabilities of the core system, without changing its function. The editor also makes it possible to increase the functional capabilities of a seed structure in a given application. For instance, the editor makes it possible, for solids, to design concurrently a solid component and its mould, as exemplified below. It makes it possible to design at the same corresponding elements of an assembly, e.g. the two parts forming a housing with their linkage. The editor also makes it possible for the expert user to create a seed structure adapted to a given application. For instance, in naval construction, walls, openings, strengthening members are combined with specific relimitations. A seed structure may be designed in the editor for capturing the design methodology used in this field. More generally, any design process used in a CAD system may be captured in a seed structure and its associated functional features.

In addition, as discussed below, the editor may allow the expert user to amend existing functional features or create new functional features.

The system of the invention further allows concurrent engineering. Concurrent engineering is the art to coordinate several designers working at the same time on a shared part or assembly. Each designer is supposed to modify the (shared) part and is also supposed to receive modifications from other designers. The key point is to reconcile the modifications. In prior art systems, this is an issue, inasmuch the order in which modifications from each designer is carried out may impact the resulting modelled object. The order independency between design changes in the invention allows straightforward merges of modifications or additions carried out by each designer.

Context-free grammars are now discussed briefly, before exemplifying the invention. Details on context-free grammars may be found in *Introduction to Automata Theory, Language and Computation*, J. E. Hopcroft and J. D. Ullmann, Addison-Wesley, 1979. Although this reference discusses context-free grammars, it does not provide any suggestion to use such grammars in computer aided design systems.

A context-free grammar G is defined by G=(X, V, P) where X is a set of terminal symbols, V is a set of non-terminal symbols and P is a set of rules. A rule is a couple (S, m) where the first object is a non-terminal symbol and the second object is a string made of terminal and non-terminal symbols; more precisely, P is a subset of V×(X∪V)*. A rule is also written as S↦m; in other words, a rule changes a non-terminal symbol into a string made of terminal and non-terminal symbols. Using a context-free grammar makes it possible to recursively produce words in a well-defined syntax as well as algorithms to scan these words, check the syntax and launch computations. In this respect, the function of a non-terminal symbol is to be replaced by a string made of terminal and non-terminal symbols—thanks to a function. A sequence of symbols in the grammar is now called a word.

The seed structure 52 is defined and edited in a context-free grammar. As such, it is merely a word in the context free grammar. The grammar first provides a formal and rigorous environment for defining seed structures; checking syntax of a seed structure edited in editor 56 makes it possible to avoid that the end-user violates syntactic rules. This is fully independent of the field of the art in which the system 42 is used.

The use of a context free grammar makes it easy to input contributions to the seed structure, by using recursive functions. Specifically, the seed structure is a word comprising a number of terminal and non-terminal symbols, which are used for applying contributions to the seed structure; the non-terminal symbols could be understood as "inputs" to the seed structure, the terminal symbols are used to specify the operations that combine the objects (solid objects in the examples). In this respect, applying a contribution to the seed structure can be carried out merely by replacing a non-terminal symbol of the seed structure by a contribution; assuming a contribution is a word, this is simply a given rule of the grammar. For ensuring recursivity—the ability to apply any number of contributions to the seed structure—it is sufficient to apply a contribution to the seed structure by replacing a non-terminal symbol of the seed structure by a sequence comprising not only the contribution but also the replaced non-terminal symbol. In the rest of this specification, a rule in which the replaced non-terminal symbol appears in the replacing string is called a substitution. Using this definition of a substitution, a contribution is applied to the seed structure by using a substitution for changing a non-terminal symbol of the seed structure into a word comprising the non-terminal symbol and the contribution. This ensures that the resulting word still comprises the non-terminal symbol, to which an additional contribution may again be applied. This further ensures that the structure of the seed structure is preserved throughout the inputting of contributions.

Using a context-free grammar further makes it easy for the expert-user to ensure that the system 42 remains declarative: it is sufficient to check that substitution rules, which allow contributions to be applied to the seed structure, remain commutative.

The simplest context-free grammar used in this invention is now discussed in reference to FIGS. 6 and 7. This grammar is defined as follows:

$X=\{a,\phi\}$ $V=\{S\}$ $P=\{S \mapsto SS\phi, S \mapsto a\}$

Symbol a is the first terminal symbol and it represents any solid—defined in the embodiment by a contribution or by an ordered sequence of primitives and operations of the core system. Symbol $\phi$ is the second terminal symbol and represents any operation, such as the operation of union (+), subtraction (−) and intersection (·). Non-terminal symbol S may be replaced by a sequence of non-terminal symbols and terminal symbols, using the rules contained in the set P of rules. Specifically, the first rule $S \mapsto SS\phi$ replaces a non-terminal symbol S by the result of the operation $\phi$ between two non-terminal symbol. This result is noted $SS\phi$, which is simply a more compact way of saying $S\phi S$. In terms of trees, the first operation replaces a leaf S of a tree by a node having two branches. The node is the result of the operation $\phi$ on two non-terminal symbols located at the end of the branches. The second operation $S \mapsto a$ replaces a non-terminal symbol by a terminal symbol and is typically used when a given value—a terminal symbol—is to be applied to a leaf of the tree.

The syntax of a word produced with this grammar may be checked by the pushdown automaton represented in FIG. 6. In this figure, state 1 is the initial status; state 2 is the final status. The syntax is correct if the automaton reaches the final status after reading the last symbol, otherwise, it is not. The person skilled in the art of formal languages understands that the syntax of any word in the grammar may be checked easily.

FIG. 7 is an example of a binary tree coded in this grammar. This tree is coded by the word abc+d−− which is a compact way of saying a−((b+c)−d). This tree is produced through the following sequence of grammar rules:

$S \mapsto SS- \mapsto aS- \mapsto aSS-- \mapsto aSd-- \mapsto aSS+d--$ $\mapsto abS+d-- \mapsto abc+d--$ In other words, one starts from a non-terminal symbol S; the first operation is applied for replacing the non-terminal symbol by a tree having two branches 60 and 62 with a − operation at the root. The second operation is applied to replace the non-terminal symbol S in the leaf of first branch 60 of the tree by a terminal symbol a. The first operation is then applied to the remaining non-terminal symbol in the leaf of branch 62, which is replaced by a tree having two branches 64, 66 with a − operation at the root. The second operation is applied to replace the non-terminal symbol S in the leaf of branch 66 of the tree by a terminal symbol d. The first operation is then applied to the non-terminal symbol in the leaf of branch 64, which is replaced by a tree having two branches 68, 70 with a + operation at the root. The second operation is applied twice to replace the non-terminal symbols S in the leaf of branches 68, 70 by terminal symbols b and c. In the example of FIG. 7, non-terminal symbol S does not appear any more, since all instances of S were replaced by a tree or a terminal symbol. In the description of FIG. 7, symbol a is used for describing the terminal symbol; it is also used as one of the possible solids a, b, c and d.

FIGS. 8-18 exemplify a design system in a first embodiment of the invention; the seed structure in this first embodiment is represented as a binary tree. For the sake of explanation, the design system is applied to the design of thin solids, such as injection-moulded plastic parts. Two functional features are provided; the first functional feature is a thin bloc and the second functional feature is a fixture.

FIG. 8 is a schematic view of a seed structure in this example. The seed structure of FIG. 8 derives from the consideration that a thin solid is structured by the subtraction of two solids; the first one is the external shape of the thin solid and the second one is the internal shape of the thin solid. A mechanical function on a thin solid can be decomposed in the following five basic operations:

add material to the external shape,
  remove material from the external shape,
  add material to the internal shape,
  remove material from the internal shape and
  remove material from the overall shape so that it can never be filled again.

The seed structure represents the fact that the basic operations are carried out in the following order:

define the external shape by adding material to the external shape and removing material from the external shape,
  define the internal shape by adding-material to the internal shape and removing material from the internal shape,
  remove the internal shape from the external shape and
  remove material from the overall shape so that it can never be filled again.

Using this order of operations will always leads to the same resulting solid.

The seed structure may be defined in the following context-free grammar $G_0=(X, V, P)$ where $X=\{a,+,-,\cdot\}$ $V=\{S,e^-,e^-,i^+,i^-,u\}$ $P=\{S \mapsto e^+e^- - i^+i^- -- u-\} \cup \{z \mapsto za+, z\epsilon\{e^+,e^-,i^+,i^-,u\}\}$ This context-free grammar is an elaborated version of the grammar disclosed in reference to FIGS. 6 and 7. As above, the first terminal symbol a represents any solid. The second, third and fourth terminal symbols +,−,· respectively stand for union, subtraction and intersection. The first non-terminal symbol S is generic; non-terminal symbols $e^+,e^-,i^+,i^-$ and u are used for the sake of convenience, for representing the input of contributions in the five operations listed above; they could be qualified as "handles". Specifically, non-terminal symbol $e^+$ is used for adding material to the external shape, etc. The geometrical evaluation of non-terminal symbols $e^+, e^-, i^+, i^-$ and u is the empty set so the geometrical shape of the seed structure is the empty set.

This allows the cohabitation with actual solids in the binary tree; in other words, non-terminal symbols $e^+, e^-, i^+, i^-$ and u may remain in the ordered sequence provided at the output of the seed structure, without this having any consequence on the solid obtained.

The first operation in the formal grammar consists in providing the seed structure. The generic symbol S is replaced by the seed structure of FIG. 8, which is written as $e^+e^--i^+i^---u-$. The leaves of the tree forming the seed structure are the symbols "$e^+$", "$e^-$", "$i^+$", "$i^-$" and "u". These leaves correspond to the five operations discussed above, in the order given above. In the seed structure, symbol "−" stands for subtraction. The tree structure may be described as follows. In node 80 of the tree, material removed from the external shape (leaf $e^-$) is subtracted from material added to the external shape (leaf $e^+$). The result is noted $e^+e^-$–in a compact representation. In node 82 of the graph, material removed from the internal shape (leaf $i^-$) is subtracted from material added to the internal shape (leaf $i^+$). The result may again be noted $i^+i^-$–. In node 84 of the graph, the result $i^+i^-$–of node 82 is subtracted from result $e^+e^-$–of node 80, thus leading to the result noted $e^+e^--i^+i^--$–in a compact representation. Practically speaking, this is tantamount to subtracting from the external shape the internal shape of the thin solid. In node 86 of the graph—which is the tree root—the material to be removed from the overall shape is subtracted from the result of node 84. This is noted $e^+e^-i^+i^---u-$ The second set of operations comprises the substitution operations, each of which consists in replacing one of the non-terminal symbols by a sequence containing a contribution and the replaced non-terminal symbol. Applying at least one substitution to the "handles" provides a modelled object.

As discussed above, the substitutions have the first property of preserving the seed structure, in that the replaced non-terminal symbol is still available after the substitution is applied, so as to allow further contributions to be applied. In addition, the substitutions have the second property that they do not change the resulting modelled object, whatever the order in which the contributions are applied. For instance, $e^+b+c+e^--i^+i^---u-$ is obtained by adding materials b and c in this order to the external shape. The modelled object is the same as $e^+c+b+e^--i^+i^---u-$ which is obtained by adding materials c and b, in this order, to the external shape. Thus, thanks to the fact that the second set of operations—substitutions—are commutative, functional features may be instantiated in any order. The resulting solid is independent from the order in which the functional features are instantiated.

As discussed above, the exemplary seed structure of FIG. 8 may be amended by an expert user. Examples of amended seed structures are provided below. For amending the seed structure, one may use the following grammar $G_1$:

$X=\{a,+,-,\cdot\}$ $V=\{S,e^+,e^-,i^+,i^-u\}$ $P=\{z \mapsto zz\phi, z \in \{S,e^+,e^-,i^+,i^-,u\}, \phi \in \{+,-,\cdot\}\} \cup \{z \mapsto a\}$ This grammar actually "includes" grammar $G_0$, as defined above, and represents a "meta-grammar". This meta-grammar makes it possible to define any seed structure. Contrary to grammar $G_0$, it does not guaranty that the system remains declarative. Indeed, grammar $G_1$ makes it possible to define non-commutative substitutions. Grammar $G_1$ may be used for checking the syntax of a seed structure amended or created by the expert user: this makes it possible to change the seed structure discussed above ($e^+e^--i^+i^---u-$) to another seed structure. Grammar $G_0$—or the amended version thereof—uses commutative substitutions and ensures that the overall system is declarative and history-free.

FIG. 9-18 show examples of a modelled object obtained using the seed structure of FIG. 8 and various functional features. The first functional feature used in the example is a basic thin bloc. It is defined by a planar profile and an extrusion length. The thickness is a predefined value attached to the mechanical part under design. Each functional feature does not redefine it. This convention is advantageous for the design of thin plastic parts, but could be done without. Assuming the thickness is defined for a given object, the functional feature may be implemented by the end-user, by providing a profile and an extrusion length.

By convention, in this example, the bottom face is the default open face. Consequently, the thin bloc is defined by two extruded solids A and B easily created from the input data: profile, height and thickness. Extruded solid A represents the material added to the external shape, that is the contribution applied to leaf $e^+$; extruded solid B represents the material added to the internal shape—and removed from the internal shape in the seed structure, that is the contribution applied to leaf $i^+$. Contributions A and B are defined by the end-user interface 42, based on the information provided by the user.

Figure 9:
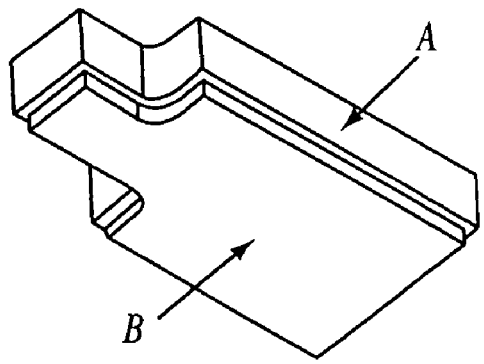
FIG. 9 is a schematic view of a first functional feature in this embodiment.
Figure 10:
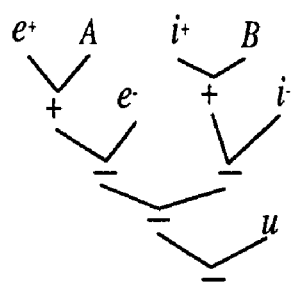
FIG. 10 shows the seed structure with the contributions of this first functional feature.

FIG. 9 shows contributions A and B; contribution A is a solid having an outside shape corresponding to the planar profile and a length L corresponding to the extrusion length; contribution B is a solid having an outside shape corresponding to the planar profile—minus the predefined thickness and the same length L. As discussed, contribution A is applied to leaf $e^+$ using operation $e^+ \mapsto e^+A+$, while contribution B is applied to leaf $i^+$, using operation $i^+ \mapsto i^+B+$. Thus, starting from the seed structure and creating a thin bloc yields the word $e^+A+e^--i^+B+i^---u-$ that is equivalent to the tree of FIG. 10. This tree yields, through a standard evaluator in the history based system, the modelled object of FIG. 11. Notice that during this evaluation, $A+e^+=A$ and $B+i^+=B$ in the evaluator.

This first example of functional feature makes it clear that the contributions applied to entries of the seed structure are defined based on the various inputs of the user. The end-user does not have to care about the various contributions. The only input of the end-user relates to the functional features and the parameters of these functional features.

Figure 12:
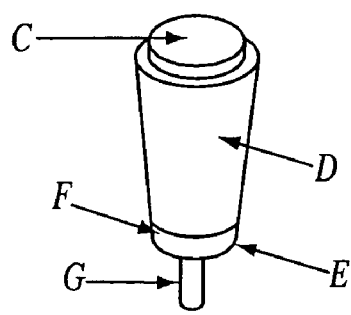
FIG. 12 is a schematic view of a second functional feature in this embodiment.

The second functional feature used in this example is a fixture feature, represented in FIG. 12. It is defined by a point in space, by a direction and a hole type; these various parameters are entered by the end-user, when embodying the functional feature. It is again assumed that the thickness is fixed for the given modelled object, otherwise this could be one additional parameter. One may use for defining the point in space and the direction the methods discussed in the prior art, e.g. datum plane and the like, as discussed in US-A-2002/0133803.

This fixture functional feature adds a drilled circular bloc and an appropriate space reservation to the part so that the assembly is easy. The fixture results in a number of contributions, referenced C, D, E, F and G in FIG. 12. The contributions are defined according to the parameters of the functional feature entered by the end-user.

The first contribution removes material from the external shape; this material is noted C on FIG. 12 and the contribution is applied to leaf $e^-$ of the seed structure, using function $e^- \mapsto e^- C+$; contribution C actually removes from the external shape a conical section, extending from the top of FIG. 12 to the upper disk of contribution F. The second and third contributions D and E remove material from the internal shape; they are applied to the leaf $i^-$ of the seed structure, using the functions $i^- \mapsto i^- D+$ and $i^- \mapsto i^- E+$). One should note at this stage that the order in which the second and third contributions are applied is of no importance to the resulting modelled object. The fourth contribution F adds material to the external shape, on leaf $e^+$, using function $e^+ \mapsto e^+ F+$. The fifth contribution G permanently removes a drilled area, using function $u \mapsto uG+$. By definition, a drilled area cannot be filled by material in any case. The role of the u symbol is to capture this property.

A fixture created on the current part leads to the updated word $e^+F+A+e^-C+-i^+B+i^-E+D+--uG+-$. This word is equivalent to the binary CSG tree represented in FIG. 13. The corresponding modelled object appears in FIG. 14. Note again that the order in which the various contributions are applied to the leaves of the seed structure is of no relevance to the evaluated modelled object. In other words, the following word $e^+A+F+e^-C+-i^+B+i^-D+E+--uG+-$ provides the same modelled object when evaluated in the history-based design system.

An additional data structure may be used for maintaining the link between the mechanical functions and the related basic solids. In the example, there may be a link between the thin solid feature and contributions A and B. There is a link as well between the fixture feature and contributions C, D, E, F and G. This makes it possible to maintain, for the end-user, the fact that several contributions—e.g. contributions A and B—actually stems from the instantiation of a given functional feature. Amendments to the functional feature would then change the various affected contributions.

Figure 11:
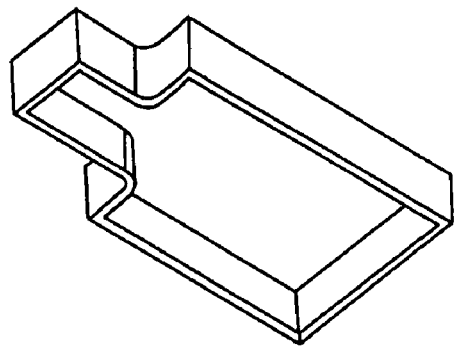
FIG. 11 is the schematic view of the corresponding modelled object.

It should also be noticed that there is no dependency between the various instantiated functional features—in the example the thin solid of FIG. 11 and the fixture of FIG. 12. From the system point of view, the fixture can exist without the thin solid. The thin solid can be deleted; the part is still valid from the syntactical and topological points of view. This is exemplified in FIGS. 15 to 17. In FIGS. 15 and 16, the fixture is instantiated in the middle of the solid. The perspective view of FIG. 15 shows the inside of the resulting thin solid with the fixture; it shows the contribution F added to the outside shape and the contribution D removed from the internal shape; the line on FIG. 15 between contributions D and F is only represented for the sake of clarity, but does not exist in the modelled object produced by the evaluator. FIG. 16 shows the upper side of the resulting thin solid with the fixture. It shows the contribution C removed from the external shape. In FIG. 17, the fixture is instantiated outside of the thin solid. Thus, contributions C, D and E do not remove any material, since they are applied in a location where there is no material to remove. Contribution F adds material to the external shape, in the form of a disk separate from thin solid A of FIG. 6. Contribution G removes material from the disk added in contribution F, so that the resulting fixture is solely a separate drilled disk. From a technical standpoint, the addition of material outside of the thin solid may appear nonsensical. From a syntactical or topological standpoint, the resulting modelled object is correct. The examples of these figures show that the fixture may be instantiated in any position, without syntactical errors. The resulting object may always be evaluated by the core system.

Furthermore, rounds, fillets and drafts can be added to basic solids. This does not change the syntax since a rounded (or drafted or filleted) basic solid behaves like a basic solid. The parameters of these additional features can be included in the functional feature definition. For example, a rounded and drafted thin solid yields the part represented in FIG. 18.

The role of the expert user and end user is illustrated through the previous example. The expert user who knows very well the thin plastic part industry designs:
 the seed structure;
 the functional features.

All the functional features may be available for the end-user in a dedicated "Thin Plastic Part" workbench. The end-user opens this workbench and designs thin parts using exclusively predefined declarative functional features.

The embodiment of FIGS. 8-18 only provides two functional features. More functional features could be defined by an expert user. For instance, in the example of thin plastic solids, one could provide other types of fixtures. A functional feature comprises on one hand the parameter(s) provided to the end-user for instantiating the functional feature. On the other hand, the functional feature comprises the various contributions to be applied to the seed structure. Each contribution is defined according to the parameters inputted by the end-user. An expert-user may define any number of functional features.

The operation of the system is explained in reference to FIGS. 8-18. The expert user first defines the seed structure and the functional features. The end-user instantiates one or more of the functional features. This results in contributions being applied to the seed structure, see FIGS. 8, 10 and 13; due to recursivity of the substitution, new contributions may always be added. At any time, the corresponding word (or the corresponding tree structure) may be evaluated in the history-based design system. For the end-user, the system appears to be history-based. However, as discussed above, any of the functional features may be amended, independently of the order in which the features are instantiated; as discussed above, this is due to the fact that the seed structure and the contributions are built so that the order in which the contributions are applied to the seed structure is irrelevant to the modelled object.

A second embodiment is disclosed in reference to FIG. 19 and 20. This embodiment makes it possible to design at the same time a part and the mould for this part. The seed structure and the contributions of FIGS. 8-18 may be used for the part. In addition, additional seed structures are provided for the upper and lower matrices of the mould.

The context free grammar in this embodiment is similar to the one discussed in reference to FIGS. 8-18. There are provided additional terminal symbols and functions:

$X = \{a, +, -, \cdot\}$ $V = \{S, U, L, e^+, e^-, i^+, i^-, u\}$ $P = P_0 \cup P_1 \cup P_2$ $P_0 = \{S \mapsto e^+ e^- - i^+ i^- - u -\} \cup \{z \mapsto za+, z \in \{e^-, e^-, i^+, i^-, u\}\}$ $P_1 = \{S \mapsto Ue^+ - e^- +\}$ $P_2 = \{S \mapsto Li + i^- -\}$ The starting shapes for the upper and lower matrices are defined as U and L; these are non terminal symbol in the exemplified context free grammar; they could of course be defined by a specific functional feature. These shapes are examples of the simplest mould, with an upper matrix U and a lower matrix L. The shape of these matrices is the end user's responsibility, especially the join surface definition.

The additional functions in $P_1$ and $P_2$ provide the seed structures for the upper and lower matrices. These seed structures are shown in FIGS. 19 and 20. The seed structure for the upper matrix in FIG. 19 is defined by the word U $e^+$-$e^-$+; U is the starting shape for the upper matrix. "Handles" $e^+$, $e^-$ have the same meaning as in the embodiment of FIGS. 8-18. The seed structure for the lower matrix in FIG. 20 is defined by the word L $i^+$+$i^-$−; L is the starting shape for the upper matrix; "handles" $i^+$ and $i^-$ are the same as in the previous embodiment. Contributions from an instantiated functional feature are applied, at the same time, to the three trees.

Specifically, assume a thin solid is defined, as discussed above in reference to FIGS. 9-11. Contribution A to the external shape is applied as discussed above in reference to FIG. 10. It is also applied to the tree of FIG. 19, leading to the word U A $e^+$+-$e^-$+. In other words, the external shape of the thin part is removed from the upper mould U. Contribution B to the internal shape is applied, as discussed above in reference to FIG. 10. In addition, this contribution is applied to the tree of FIG. 20, leading to the word L B $i^+$++$i^-$−; this means that the internal shape of the thin solid is added to the lower mould L. One understands at this stage that the upper and lower moulds are defined at the same time as the parts themselves, simply by providing addition words or seed structures for the upper and lower moulds. One understand that contributions are the same as those defined above; however the seed structure comprise three separate words for the modelled object, the upper mould and the lower mould.

Assume now the second functional feature is instantiated for adding a fixture. The tree of FIG. 19 would become U A F$e^+$++-C $e^-$++, while the tree of FIG. 20 would become L B $i^+$++D $i^-$+E+−. This example shows that the seed structure may comprise several words, for designing concurrently the part as well as the upper and lower moulds.

Thus, instantiating a new functional feature in the part automatically updates the shape of the upper and lower matrices. Notice that the u non-terminal symbol does not appear in the mould structures since the machining features do not appear on the part right out of the mould.

The example of FIGS. 19-20 shows that letting the expert-user amend the seed structure makes it possible for this expert-user to adapt the design systems to his needs.

FIGS. 21-29 exemplify a design system in another embodiment of the invention; the system in this embodiment uses a non-binary tree. The non-binary tree makes it possible to provide a simpler and shorter seed structure. The generic non-binary context-free grammar is disclosed in reference to FIGS. 21-24. A first example of a tree structure using a specific non-binary context free grammar is disclosed in reference to FIGS. 24-26. A second example of use of a non-binary tree is disclosed in reference to FIGS. 27-28. The description in reference to FIG. 29 disclose the same seed structure as in FIGS. 8-18, using non-binary trees.

The following context free grammar is used in this embodiment. The grammar is $G_T$=(X, V, P) where X={a,$\delta$}

V={S,T}

P={S$\mapsto$ST$\delta$S,T$\mapsto$ST$\delta$,S$\mapsto$a,T$\mapsto$1}

Terminal symbol a represents any node of the tree. Terminal symbol $\delta$ is a syntactical feature that counts the number of children nodes under a parent node; it is used for building the tree. At this level of abstraction, there is no distinction between operand symbols and operation symbols. This specialization is done by the application that uses the grammar. This explains that the set of terminal symbols, contrary to the example provided above, does not contain any "operation".

Non-terminal symbol S may be replaced by a sequence of non-terminal symbols and terminal symbols, using the rules contained in the set P of rules. Non-terminal symbol T is used for the sake of adding branches to the tree and with terminal symbol $\delta$, for counting branches in a tree. In other words, non-terminal symbol T makes it possible to allow a substitution at any place in a tree.

First rule S$\mapsto$ST$\delta$S replaces non-terminal symbol S by a tree with one branch. Second rule S$\mapsto$ST$\delta$ adds one branch to node S of the tree. Third rule S$\mapsto$a replaces a non-terminal symbol by a terminal symbol and is typically used when a given value—a terminal symbol—is to be applied to a node of the tree. Fourth rule T$\mapsto$1 replaces non-terminal symbol by a 1, thus deleting non-terminal symbol T from the seed structure. This fourth rule is used when there is no need to add more branches to a given node, notably when the tree is completed.

Clearly, any binary tree is compliant with this language provided it is rewritten substituting $\phi$ by $\delta^2\phi$. This grammar therefore covers the grammars discussed above.

FIG. 21 exemplifies the use of this grammar, on a tree coded by the word ahbcd$\delta^3$e$\delta$g$\delta^3$i. This tree is produced by the following sequence of grammar rules:

$S\mapsto ST\delta S\mapsto ST\delta i\mapsto aT\delta i\mapsto aST\delta^2 i\mapsto ahT\delta^2 i$
$\mapsto ahST\delta^3 i\mapsto ahST\delta ST\delta^3 i\mapsto ahST\delta gT\delta^3 i$
$\mapsto ahST\delta ST\delta gT\delta^3 i\mapsto ahST\delta eT\delta gT\delta^3 i$
$\mapsto ahSST\delta^2 eT\delta gT\delta^3 i\mapsto ahSSST\delta^3 eT\delta gT\delta^3 i$
$\mapsto ahbSST\delta^3 eT\delta gT\delta^3 i\mapsto ahbcST\delta^3 eT\delta gT\delta^3 i$
$\mapsto ahbcdT\delta^3 eT\delta gT\delta^3 i\mapsto ahbcd\delta^3 e\delta g\delta^3 i$ FIG. 22 shows an automaton which is able to check the syntax of a word produced with this grammar. State 0 is the initial state, state 1 is the final state.

The equivalence between the tree and the word can be demonstrated by associating actions with the automaton transitions. Two heaps are useful: $H_1$ and $H_2$. Standard operations on heaps are available: pop up (put an object on top of the heap) and push down (get an object from the top of the heap). The actions associated with the transition (p,a,q) are While $H_2$ is not empty do begin
   Get y from top of $H_2$.
   Add the arc (y,a) to the tree.
End
Put a on top of $H_1$.

The actions associated to the transition (q,$\delta$,p) are
   Get y from top of $H_1$.
   Put y on top of $H_2$.

After the whole word is scanned, heap $H_1$ should contain only one object, which is the root node and heap $H_2$ should be empty. Otherwise, the syntax is not correct. The automaton of FIG. 22 thus makes it possible the check the syntax of any tree in the grammar. The use of such automaton thus makes it possible, in the editor, to check the syntax of seed structure inputted by the expert user.

The previous grammar defines a meta-language thanks to the following reason. Any (context free) grammar can be described by a graph, which captures the non-terminal symbols, the terminal symbols and the rules in a so-called derivation tree. Since the previous grammar is designed to describe any tree, it can describe itself. The derivation tree of the tree grammar is represented in FIG. 23. Thus, any tree may be described in this context-free grammar. The editor may use this meta-language, or a more restricted version of the language, with some terminal symbol specifically designed. Using a generic meta-language increased the field of possible adaptations of the design system, but increases the work to be carried out by the skilled user. On the other hand, defining more specifically the symbol or operations of the language helps the skilled user in writing or amending the seed structure.

The grammar discussed in reference to FIGS. 21-23 further makes it possible to cover any directed acyclic graph, provided the graph does not contain any loop or cycle. This extension allows the language to handle shared data, shared inputs or results in the data flow of the part structure. Data may thus be shared in the design system.

FIG. 24 is a directed acyclic graph, which could represent a product or the structure of a modelled object. This graph may be changed into a tree by duplicating the shared nodes as many times as necessary; the resulting tree is represented in FIG. 25.

The sharing is captured through symbol repetition. Since the initial graph features two root nodes, i and j, duplicating shared nodes yields two trees, respectively coded by the words $aebc\delta^2 ecd\delta^2 f\delta^2 hg\delta^4 i$ and $gfd\delta^3 j$. The decomposition of an acyclic graph into a set of trees is not unique. For example, the previous graph could lead to the tree of FIG. 26 and to the following words.

$$abce\delta^2 efh\delta^2 g\delta^4 i$$

$$gcd\delta^2 fd\delta^3 j$$

This non-uniqueness of tree decomposition is not a trouble because the same level of information is captured. Criteria for a better or for the best possible decomposition are the application's responsibility.

One also understands from the example of FIGS. 24-26 that the seed structure and the resulting words need not be unique, as already exemplified in reference to FIGS. 19 and 20.

FIGS. 27 and 28 disclose a tree structure using a non-binary tree defined in a grammar derived from the one of FIGS. 21-23. The tree is used for designing a complex assembly of parts and captures the top down recursive decomposition of the main product into its components. The " . . . includes . . . " semantic link is captured by the system. The product structure grammar allows the expert user to design a predefined skeleton structure in such a way that any device added to the main product automatically updates the relevant sub products. It should be noticed that there is no order dependency in the product structure context. The added value is the structure definition and the ease of adding a new device.

The word $S_1 T_1 \delta a S_2 T_2 \delta b f T_3 \delta c \delta^3 d$ captures a simple tree structure represented in FIG. 27; the structure is equipped with non-terminal symbols of type S and T. These are provided with indices for the sake of understanding only. In this tree, d is an assembly of parts or sub-products a,b and c.f is a component of sub-product c. The non-binary grammar makes it possible to add components e in sub-product a and components g and h in sub-product c, thanks to the following operations:

$$T_1 \mapsto eT_1\delta$$

$$T_3 \mapsto gT_3\delta$$

$$T_3 \mapsto hT_3\delta$$

Note that type T symbols allow $T \mapsto xT\delta$ substitutions, where x is a terminal symbol. This yields the following word $S_1 e T_1 \delta^2 a S_2 T_2 \delta b f g T_3 \delta^3 c \delta^3 d$ and the tree of FIG. 28. As previously, non-terminal symbols $S_1$ and $S_2$ remain available for further substitutions.

The use of a non-binary tree thus makes it easier to add components or contributions at a given level, without any limitation on the number of components added.

A non-binary tree may be used for a seed structure directed to thin solids, as in FIGS. 8-18. The formal grammar is the following:

$$X=\{a,+,-,\delta\}$$

$$V=\{S,e^+,e^-,i^+,i^-,u\}$$

$$P=\{S \mapsto e^+\delta+e^-\delta+\delta^2-i^+\delta+i^-\delta+\delta^2-\delta^2-u\delta+\delta^2-\}\cup\{z$$
$$\mapsto az\delta, z \in \{e^+,e^-,i^+,i^-,u\}\}^{As}$$

compared to the grammar discussed in reference to FIGS. 8-18, this grammar contains additional terminal symbol $\delta$; as discussed above, this is used for the sake of counting the number of branches issued from a given node. One has not used in this discussion the non-terminal symbol T, simply for the sake of clarity of the discussion.

The first operation in the set P of operations provides the seed structure. The word is $e^+\delta+e^-\delta+\delta^2-i^+\delta+i^-\delta+\delta^2-\delta^2-u\delta+\delta^2-$ and the corresponding tree is FIG. 8, and is represented in FIG. 29. Once more, this seed structure is built using the meta-grammar. However, there is provided the ability to add branches to the tree, thanks to substitutions. The substitutions are operations of the type $z \mapsto Az\delta$ where z stands for any of the non-terminal symbols $e^+$, $e^-$, $i^+$, $i^-$ and u. A substitution thus adds a new operand to the list that contains z. In other words, a substitution adds a brother to z. This simplifies the tree, in that the depth of the tree is limited, compared to the embodiment of FIGS. 8-18.

Contributions may be defined as discussed above. Instantiating the contributions of a thin solid and fixtures, as above, provides the tree of FIG. 30, or the following word $$AFe^+\delta^3+Ce^-\delta^2+\delta^2-Bi^+\delta^2+DEi^-\delta^3+\delta^2-\delta^2-Gu\delta^2+\delta^2-$$

Figure 14:
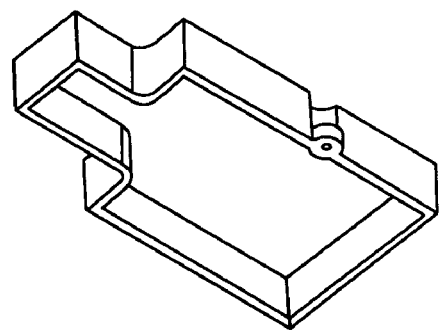
FIG. 14 is the schematic view of the corresponding modelled object.

It is fully clear that the evaluation of this word in the history based design system provides the modelled object of FIG. 14. However, the tree of FIG. 30 has a depth of 4 while the tree of FIG. 13 has a depth of 5. Additional contributions in the seed structure of FIG. 8 would cause the depth of the tree to feather increase, while additional contributions to the seed structure of this embodiment would not cause any increase in the depth of the tree of FIG. 30.

Thus, the use of a non-binary context-free grammar for defining the seed structure expands the possibilities availed to the expert user.

A third embodiment of the invention is now discussed in reference to FIGS. 31-34. The third embodiment makes it possible to speed up the evaluation of a modelled object after changes to components of this modelled object. For this purpose, the intermediate solids are kept, inasmuch as possible, to avoid re-evaluation in cases of changes.

The problem of changes to components is exemplified in reference to FIG. 31. This shows a tree structure similar to the one of FIG. 13—but without the "handles". Assume leaf L in this tree is modified. If the intermediate solids are kept, the replayed operations are those on the path from the root solid to the modified leaf solid; in the example of FIG. 31, the only replayed are those on the path from leaf L to the root of the tree, that is the four operations indicated in FIG. 31. To get the new shape of the solid, only four operations need to be recomputed.

To preserve this benefit, substitutions should increment the structure in such a way that existing intermediate solids remain unchanged as much as possible. This is not the case with the binary tree grammar and the seed structure of FIG. 8, because the new solids appear on top of existing solids. This may cause useless B-rep operations.

The goal of the grammar and seed structure in this third embodiment is to place the new solids at the best possible place in the structure. The grammar is the following:

$X=\{a,+,-,x\}$ $V=\{S,e^+,e^-,i^+,i^-,u\}$ $P=\{S\mapsto xe^++xe^-+-xi^++xi^--xu+-\}\cup\{z\mapsto a+z, z\in\{e^+,e^-,i^+,i^-,u\}\}$ In this grammar, the symbol x stands for a dummy solid that evaluates as the empty set. The seed structure is provided by the first operation, while the substitutions are provided in the other operations. The substitutions are clearly commutative, for the reasons discussed above.

The seed structure is the word $xe^++xe^-+-xi^++xi^-+--xu+-$ and it is represented as a tree in FIG. 32. From a qualitative point of view, each of the "handles" in FIG. 8 is replaced by a two-leaves tree formed of a terminal symbol x and of the corresponding handle.

A substitution rule is defined, as expressed in the grammar, by $z\mapsto a+z$, where z again stands for any of the non-terminal symbols $e^+$, $e^-$, $i^+$, $i^-$ and u and where a stands for any basic solid.

The operation of this seed structure is again exemplified with the same thin solid and fixture of FIGS. 11 and 12. The thin solid functional feature is captured by the following substitutions:

$e^+\mapsto A+e^+$ $i^+\mapsto B+i^+$ which leads to the tree represented in FIG. 33 or to the following word:

$xA+e^++xe^-+-xB+i^++xi^-+--xu+-$

The fixture functional feature is capture by the following substitutions $e^+\mapsto F+e^+$ $e^-\mapsto C+e^-$ $i^-\mapsto D+i^-$ $i^-\mapsto E+i^-$ $u\mapsto G+u$ These substitutions provide the tree represented in FIG. 34 and the following word:

$xA+F+e^++xC+e^-+-xB+i^++xD+E+i^-+--xG+u+-$

As expected due to the grammar, new basic solids appear in the tree after existing solids. Thus, intermediate results may be kept and re-used even after new solids are added. For instance, F is after A, E is after D.

In this embodiment, one uses a binary tree and a grammar derived from the one disclosed above in reference to FIGS. 8-18. It is noteworthy that the advantages discussed in this third embodiment also apply to a non-binary tree. One could also apply the same solution to other seed structures, for modelled objects other than thin solids.

The invention is not limited to the examples provided in the detailed description. One may notably use history-based design systems different from the one discussed in the examples. The various solutions discussed in reference to each embodiment may be applied to the other embodiments. This applies notably to the discussion of the functions of the expert user and to the discussion of the operation of the system given in reference to the first embodiment of FIGS. 8-18. These also apply to the other embodiments.

The examples given above refer to moulded thin solids. Additional or alternative operations and contributions could be used for other types of modelled objects. For instance, for assemblies of parts, one could additionally allow parts to be juxtaposed. This would simply represent an additional non-terminal symbol. For designing modelled objects out of a surface—e.g. stamped metal car parts—one could use a terminal symbols curves and surfaces. The operations could then comprise relimitation for stamping part of an existing modelled object or cut, for cutting a curve or surface.

In the examples provided above, the non-terminal symbols are all used in the initial seed structure. A sequence of substitution rules may introduce a new non-terminal symbol that was not in the initial seed structure. This capability allows a seed structure to become more complex. Dynamic non-terminal symbols can be reused in further substitution rules. For example, after a few design steps, the need is to add material to the solid part after the first subtraction. The tree structure of FIG. 30 cannot support this operation and could be changed into the structure of FIG. 35 for allowing the addition of material. The tree of FIG. 35 features the new non terminal symbol f that is ready to capture solid contributions. The sequence of substitution rules starts with the expression $AFe^+\delta^3+Ce^-\delta^2+\delta^2-Bi^+\delta^2+DEi^-\delta^3+\delta^2-\delta^2-GU\delta^2+\delta^2-$ which represents the tree of FIG. 30. In this expression, the first subtraction symbol is replaced by the non terminal symbol $\overline{S}$, which saves the syntax and prepares the node insertion. This provides the following expression:

$AFe^+\delta^3+Ce^-\delta^2+\delta^2\overline{S}Bi^+\delta^2+DEi^-\delta^3+\delta^2-\delta^2-Gu\delta^2+\delta^2-$ As expected, the seed structure edition involves the meta-grammar.

Then, the following substitutions are executed.

$\overline{S}\mapsto \overline{S}T\delta\overline{S}\mapsto \overline{SS}T\delta^2\overline{S}\mapsto -\overline{S}T\delta^2\overline{S}\mapsto -\overline{S}T\delta^2+\mapsto -$
$\overline{S}\delta^2+\mapsto -\overline{S}T\delta\overline{S}\delta^2+\mapsto -fT\delta\overline{S}\delta^2+\mapsto -fT\delta+\delta^2+$
$\mapsto -f\delta+\delta^2+$ and the resulting expression corresponds to the expected tree of FIG. 35.

$AFe^+\delta^3+Ce^{-\delta 2}+\delta^2-f\delta+\delta^2+Bi^+\delta^2+DEi^-\delta^3+\delta^2-\delta^2-Gu\delta^2+\delta^2-$ This example shows that it is possible, using the same meta-grammar, to amend the seed structure for producing a more complex seed structure.

It is also possible to execute or not a substitution rule, attached to a functional feature, according to the value of a logical variable. This variable, commonly called the "activity", may be embedded in the functional feature definition and the end-user defines its value ("true" or "false") through any rule or program. This makes it possible to maintain a functional feature in the modelled object, without it being considered by the evaluator in the core system. The functional feature is inactivated and may be activated if and when needed. Using a logical variable also makes it possible to provide additional view of the modelled object. For instance, one may wish to provide a view of the modelled object, before any machining step. One would then inactivate the contributions applied to handle u before evaluating the modelled object. This example shows that it is possible to inactivate not only a full functional feature, but also a contribution of a functional feature.

Last, a substitution rule need not be executed if the replaced non-terminal symbol is not in the target structure. This is a standard behaviour of substitution rules and will not lead to an error message. For instance, in the example of upper and lower moulds, the seed structures of FIGS. 19 and 20 do not comprise the handle u. This does not prevent the system from applying the fixture functional feature to the upper and lower moulds, without the contribution G being considered.

The implementation of the invention in a computer system was not discussed in full detail above. The implementation of a history-based design system 40 is well known to the person skilled in the art. The additional features of FIG. 5 may be implemented in the same or another computer system, by using tools such as existing programming languages (C++, Java, Fortran, etc.), as well as library of programs usually available in any CAD system. The programs in such libraries make it possible to create objects;
write objects;
read modelled objects, etc.

One may thus implement the invention, as represented in FIG. 5, on any existing CAD system, which is then used as the core system 40 of FIG. 5.

This is also made easier, since most existing CAD systems provide a programmation platform in which the additional elements of the invention may be programmed.

The invention was described in the reference to the preferred embodiment of CAD systems but can be applied to computer-aided manufacturing (CAM) systems and to computer-aided engineering (CAE) systems. One may use similar grammars and meta-grammars for other systems, such as product data management (PDM) systems, virtual product modelling (VPM) or product lifecycle management (PLM) systems, but also for enterprise resource planning (ERP) systems. Such systems organize tasks to be carried out on products (in a generic meaning). In such a system which usually relies on a process modeller, queries and tasks are order-sensitive.

The following table shows an example of a possible correspondence between the elements of the described CAD system and a PDM system:

| history-based design system | order based query system; |
|---|---|
| functional feature | parametric task; |
| feature parameters | task parameters; |
| part | task; |
| primitive | elementary action; |
| operation | operation. |

A task in a PDM system is an ordered sequence of elementary actions and operations and corresponds to a part in a CAD system. The table shows that the solutions discussed above in reference to CAD systems also apply to PDM systems and provide similar advantages.

The invention claimed is:

1. A system for designing parts or assemblies of parts, with
   (a) a history-based design system having a storage format with primitives and operations, a part or assembly of parts being defined in the history-based design system by an ordered sequence of operations and primitives;
   (b) at least two functional features, each of which is adapted to be instantiated by an end user by providing a set of specifications, an instantiated functional feature providing at least a contribution, a contribution being an ordered sequence of operations and primitives of the history-based design system, wherein an order of instantiation of the at least two functional features defines a creation order of contributions provided by the at least two functional features;
   (c) a non history seed structure defined using a context-free grammar, the seed structure being adapted to receive contributions from instantiated functional features, to order operations and primitives of received contributions and to provide an ordered sequence of operations and primitives to the history-based system, using the creation order of contributions;
   (d) an editor for editing the seed structure in said grammar, and
   (e) a display for displaying the part or assembly of parts that is independent of the order of instantiation of the functional features and that uses the history based system.

2. The system of claim 1, wherein the operations comprise commutative operations and non-commutative operations, wherein the seed structure has inputs adapted to receive contributions and wherein the seed structure is adapted to apply commutative operations to the contributions received on each input and to apply commutative or non-commutative operations to the results of the commutative operations applied to said contributions.

3. The system of claim 1, wherein the seed structure is represented in the context-free grammar as an acyclic oriented graph.

4. The system of claim 3, wherein the seed structure is a binary tree.

5. The system of claim 3, wherein the seed structure is a non-binary tree.

6. The system of claim 1, wherein a terminal alphabet of the context free grammar comprises at least a solid, union, intersection and subtraction.

7. The system of claim 6, wherein the terminal alphabet further comprises juxtaposition.

8. The system of claim 1, wherein a terminal alphabet of the context free grammar comprises at least a curve, at least a surface and relimitation.

9. A process for providing a history-free system for the design of parts or assemblies of parts, the process comprising the steps of:
   (a) providing a history-based design system having a storage format with primitives and operations, a part or assembly of parts being defined in the history-based design system by an ordered sequence of operations and primitives
   (b) providing at least two functional features, each of which is adapted to be instantiated by an end user by providing a set of specifications, an instantiated functional feature providing at least a contribution, a contribution being an ordered sequence of operations and primitives of the history-based design system, wherein an order of instantiation of the at least two functional features defines a creation order of contributions provided by the at least two functional features; p1 (c) using a context-free grammar to define a seed structure, the seed structure being adapted to receive contributions from instantiated functional features, to order operations and primitives of received contributions and to provide an ordered sequence of operations and primitives to the history-based system, using the creation order of contributions, and (d) displaying the part or assembly of parts, independently of the order of instantiation of the functional features and using the history-based system.

10. The process of claim 9, wherein the operations comprise commutative operations and non-commutative operations, wherein the step of using comprises providing a seed structure having inputs adapted to receive contributions and wherein the seed structure is adapted to apply commutative operations to the contributions received on each input and to apply commutative or non-commutative operations to the results of the commutative operations applied to said contributions.

11. The process of claim 9, wherein the step of using comprises defining the seed structure as an acyclic oriented graph.

12. The process of claim 11, wherein the step of using comprises defining the seed structure as a binary tree.

13. The process of claim 11, wherein the step of using comprises defining the seed structure as a non-binary tree.

14. The process of claim 10, wherein the step of using comprises defining the seed structure as an acyclic oriented graph.

15. The system of claim 2, wherein the seed structure is represented in the context-free grammar as an acyclic oriented graph.

16. The system of claim 2, wherein a terminal alphabet of the context free grammar comprises at least a solid, union, intersection and subtraction.

17. The system of claim 3, wherein a terminal alphabet of the context free grammar comprises at least a solid, union, intersection and subtraction.

18. The system claim 2, wherein a terminal alphabet of the context free grammar comprises at least a curve, at least a surface and relimitation.

19. The system of claim 3, wherein a terminal alphabet of the context free grammar comprises at least a curve, at least a surface and relimitation.

* * * * *

UNITED STATES PATENT AND TRADEMARK OFFICE
CERTIFICATE OF CORRECTION

PATENT NO. : 7,495,662 B2
APPLICATION NO. : 10/898068
DATED : February 24, 2009
INVENTOR(S) : Rameau et al.

Page 1 of 1

It is certified that error appears in the above-identified patent and that said Letters Patent is hereby corrected as shown below:

Column 18, line 47, cancel the text "feather" and replace with "further".

In the claims:

Claim 1: Column 22, line 18, cancel the text "(c) a non history seed structure" and replace with "(c) a seed structure".

Claim 9: Column 23, line 3, delete the text "p21".

Signed and Sealed this

Second Day of June, 2009

JOHN DOLL
*Acting Director of the United States Patent and Trademark Office*